United States Patent [19]
Nakajima

[11] 3,937,982
[45] Feb. 10, 1976

[54] GATE CIRCUIT
[75] Inventor: Toshio Nakajima, Tokyo, Japan
[73] Assignee: Nippon Electric Co., Inc., Tokyo, Japan
[22] Filed: Mar. 18, 1974
[21] Appl. No.: 452,425

[30] Foreign Application Priority Data
  Mar. 20, 1973  Japan .................... 48-32892

[52] U.S. Cl. ............. 307/205; 307/215; 307/221 C; 307/279
[51] Int. Cl.[2] .............. H03K 19/08; H03K 19/34; H03K 19/36; H03K 3/353
[58] Field of Search ....... 307/205, 214, 215, 221 C, 307/251, 255, 279, 288, 313, 218

[56] References Cited
UNITED STATES PATENTS

| | | | |
|---|---|---|---|
| 3,551,693 | 12/1970 | Burns et al. | 307/205 |
| 3,573,498 | 4/1971 | Ahrons | 307/205 X |
| 3,626,202 | 12/1971 | Pound | 307/205 X |
| 3,641,511 | 2/1972 | Cricchi et al. | 307/279 X |
| 3,737,673 | 6/1973 | Suzuki | 307/205 |
| 3,746,882 | 7/1973 | Heimbigner | 307/205 |
| 3,749,937 | 7/1973 | Rogers | 307/251 X |
| 3,760,380 | 9/1973 | Hoffman et al. | 307/313 X |
| 3,766,408 | 10/1973 | Suzuki et al. | 307/279 X |
| 3,769,523 | 10/1973 | Suzuki | 307/205 |

OTHER PUBLICATIONS
Long, "Dynamic Logic Circuit Family," IBM Tech. Discl. Bull.; Vol. 16, No. 5, p. 1560; 10/1973.

Primary Examiner—John S. Heyman
Assistant Examiner—L. N. Anagnos
Attorney, Agent, or Firm—Hopgood, Calimafde, Kalil, Blaustein & Lieberman

[57] ABSTRACT

A gate circuit employing insulated gate field effect transistors of complementary types includes a logic circuit such as an inverter, a NAND or a NOR circuit which is connected to an inverter circuit. Bias means are connected to the logic circuit through a first switching means and to the inverter circuit through a second switching means. A common clock signal is used to switch both the first and second switching means.

10 Claims, 8 Drawing Figures 3,937,982

GATE CIRCUIT

BACKGROUND OF THE INVENTION

The present invention relates to a gate circuit which employs complementary insulated gate field-effect transistors, and more particularly to such a gate circuit having a delay function.

In the field of digital equipment, gate circuits are widely used. Such a gate circuit can be used for instance to temporarily store information from the time when a first clock pulse is applied to the circuit until the next clock pulse is applied to the circuit. Such a gate circuit is generally called a delay type flip-flop or a D-type flip-flop and is widely used as a basic portion of digital circuits such as shift registers and counters.

Conventional gate circuits of this type employing insulated gate field effect transistors (IGFET's) can be broadly classified into two kinds. One kind utilizes single conductivity type IGFET's and another kind utilizes IGFET's of two complementary conductivity types. Use of circuits having complementary conductivity type IGFET's is greatly advantageous as compared to circuits having single conductivity type IGFET's in that the range of operating voltage of such circuits is widened and the power dissipation is minimized. On the other hand, circuits employing IGFET's of two conductivity types have the disadvantage that two clock signals of different polarities are required for control of the circuit.

An object of the present invention is to provide a gate circuit employing complementary IGFET pairs and having a delay function which can be controlled by a single clock signal.

SUMMARY OF THE INVENTION

A gate circuit utilizing insulated gate field effect transistors of complementary conductivity types includes a logic circuit having an input terminal and an output terminal, an inverter circuit having an input and an output terminal, the output terminal of the logic circuit being connected to the input terminal of the inverter circuit, bias means, first switching means connected in series with the bias means and the logic circuit, second switching means connected in series with the inverter circuit and the bias means and means to apply a common control signal to both the first and second switching means.

DESCRIPTION OF THE DRAWINGS

The present invention will be described more in detail with reference to the accompanying drawings, in which.

DESCRIPTION OF THE INVENTION

While, in the following description, MOS transistors are used as the IGFET's in the gate circuit, it is to be understood that the fundamental idea of the present invention is applicable to other kinds of IGFET's.

Figure 1:
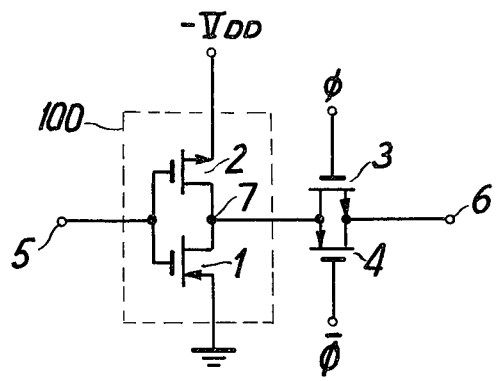
FIG. 1 is a circuit diagram showing a conventional D-type flip-flop circuit having a delay function which is composed of complementary IGFET's.

Referring to FIG. 1, a prior-art circuit of the D-type flip-flop comprises a complementary MOS transistor pair 100 which includes a P-channel MOS transistor 1 and an N-channel MOS transistor 2. The source of the P-channel MOS transistor 1 is grounded. The drain of the P-channel MOS transistor is connected at a node 7, to the drain of the N-channel MOS transistor 2. The source of the N-channel MOS transistor 2 is connected to a power source — $V_{DD}$. The gates of the respective MOS transistors 1 and 2 are connected to each other, and to an input terminal 5. A P-channel MOS transistor 4 and an N-channel MOS transistor 3 are connected in parallel by connecting the source of one transistor to the drain of the other. One terminal of this parallel connection is connected to the node 7, while the other terminal of the parallel connection is connected to an output terminal 6.

The gate of the P-channel MOS transistor 3 is supplied with clock signal $\phi$ and the gate of the N-channel MOS transistor is supplied with clock signal $\overline{\phi}$. Clock signals $\phi$ and $\overline{\phi}$ are opposite in polarity to each other. By this means output signals opposite in polarity to the input signals applied at terminal 5 are periodically obtained at the output terminal 6. As can be understood from the above description, the prior-art gate circuit employing complementary MOS transistor pairs requires the application of two clock signals (such as $\phi$ and $\overline{\phi}$) which are opposite in polarity to each other.

Figure 2:
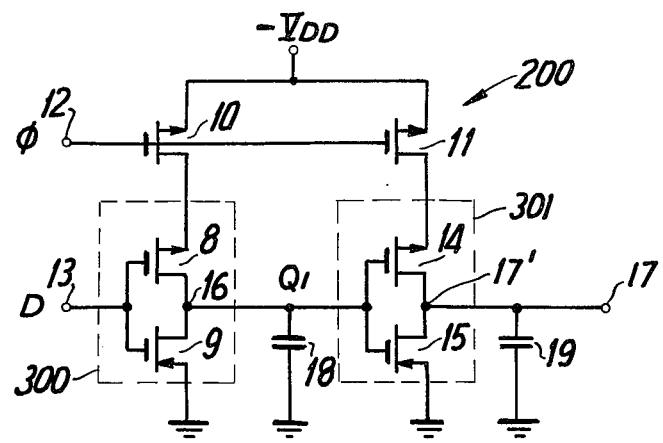
FIG. 2 is a circuit diagram showing an embodiment of the present invention.

FIG. 2 is a circuit diagram of a gate circuit 200 which is an embodiment of the present invention. An N-channel MOS transistor 8 and a P-channel MOS transistor 9 are connected in series by having the respective drains connected in common at terminal 16. These transistors constitute a complementary MOS transistor inverter circuit 300 which corresponds to a logic circuit. The respective gates of transistors 8 and 9 are connected in common and are connected to an input terminal 13. Likewise, a complementary pair comprising an N-channel MOS transistor 14 and a P-channel MOS transistor 15 constitute another inverter circuit 301. The gates of the MOS transistors 14 and 15 are connected in common and are further connected to the output terminal 16 of the inverter circuit 300 at the preceding stage. Terminal 16 is the common connection point of the drains of the transistors 8 and 9. The drains of transistors 14 and 15 are connected together and to the output terminal 17' of the inverter circuit 301. Terminal 17' is in turn connected to terminal 17 which is the output terminal for gate circuit 200. At the outputs of the respective inverter circuits 300 and 301, parasitic capacitances are formed by the transistor elements and accompanying wirings. These capacitances are shown in FIG. 2 for circuit 300 and 301 respectively as capacitors 18 and 19. The source electrodes of the P-channel MOS transistors 9 and 15 of the respective inverter circuits 300 and 301 are grounded. A power source — $V_{DD}$ is connected in common to the source electrodes of both of the N-channel MOS transistors 10 and 11. The gates of transistors 10 and 11 are both connected to terminal 12. The drain electrode of transistor 10 is connected to the source electrode of transistor 8 of inverter circuit 300. The drain electrode of transistor 11 is connected to the source electrode of transistor 14 of circuit 301. The N-channel MOS transistors 10 and 11 comprise first and second switching elements. The gates of the switching MOS transistors 10 and 11 are connected through a common control terminal 12 to a source of a clock signal $\phi$.

Figure 3:
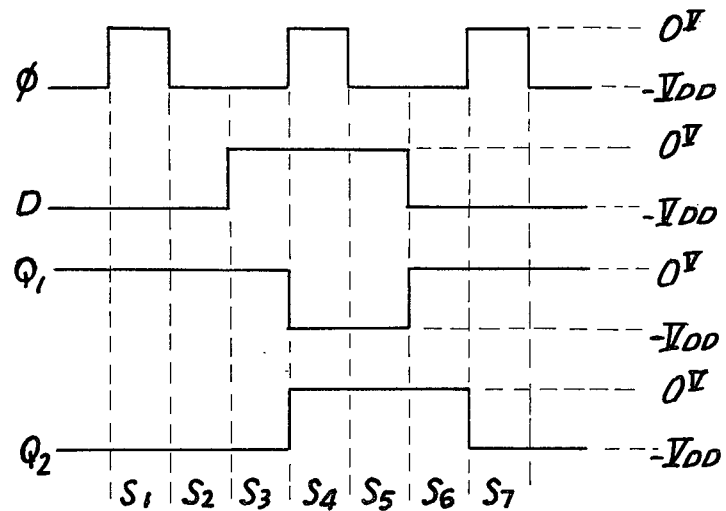
FIG. 3 shows signal waveforms at various indicated portions of the circuit shown in FIG. 2 at various intervals of time.

The operation of the circuit in FIG. 2 will now be explained with reference to FIG. 3. As shown in FIG. 3 the control terminal 12 is supplied with the clock signal $\phi$ which is at a high level (0 volt) during time intervals $S_1$, $S_4$ and $S_7$ and at a low level ($-V_{DD}$ volt) during the other time intervals $S_2$, $S_3$, $S_5$ and $S_6$. The input terminal 13 of inverter 300 is supplied with an input signal D which is at the high level (0 volt) during the time intervals $S_3$, $S_4$, and $S_5$, and is at the low level ($-V_{DD}$ volt) during the other time intervals including $S_1$, $S_2$, $S_6$, and $S_7$.

The MOS transistors 10 and 11 are conductive in the time interval $S_1$ since a high pulse is applied to their gates so that the inverter circuits 300 and 301 effect the usual inverter operation. Since the input signal D is at the low level transistor 9 conducts causing $Q_1$ to be at ground potential or high. Since the level $Q_1$ at the output terminal 16 of the inverter 300 becomes high, the transistor 14 will conduct. This in turn causes the level $Q_2$ of the output terminal 17 to become low by providing a path to power supply $-V_{DD}$ which places a negative charge on capacitor 19.

Although the MOS transistors 10 and 11 are in a nonconductive state during the time interval $S_2$, the level $Q_1$ remains high since the MOS transistor 9 is conductive during this time interval. The MOS transistor 15 is in the non-conductive state during this time period and the level $Q_2$ is retained at the negative voltage to which the capacitor 19 has been charged during the time interval $S_1$. When the input D changes from $-V_{DD}$ to 0 volt in the time interval $S_3$, the MOS transistor 9 becomes non-conductive and the MOS transistor 8 changes to the conducting state. However, since the MOS transistor 10 is in the non-conductive state the capacitor 18 will not be charged by the power source ($-V_{DD}$) and the level $Q_1$ will remain at the high level. Since the level $Q_1$ does not change, the level $Q_2$ is still held at the low level by the charge on capacitor 19. When the clock pulse $\phi$ becomes high causing MOS transistor 10 and 11 to conduct in the time interval $S_4$, the inverter circuits 300 and 301 then effect the usual inverter operation. The transistor 8 has a high voltage on its gate causing it to conduct and charging capacitor 18 with a negative charge reducing $Q_1$ to the low level. This in turn causes transistor 15 to conduct and the charge leaks off capacitor 19 permitting $Q_2$ to go to the high level. $\phi$ becomes low in time interval $S_5$ causing the MOS transistors 10 and 11 to become non-conductive. The input signal D is high (0 volt) in this period causing the MOS transistor 8 to be in the conductive state and the MOS transistor 9 to be in the non-conductive state. Consequently, the level $Q_1$ is held at a low level by the charge stored on the capacitor 18 during the preceding time interval $S_4$. This causes the MOS transistor 15 to be in the conductive state and the level of $Q_2$ remains high. When the input signal D changes to $-V_{DD}$ volt in the time interval $S_6$, $Q_1$ changes to the high level, because transistor 9 becomes conductive permitting the charge to leak off capacitor 18. $Q_2$ remains at the high level since capacitor 19 is not charged during this period. Subsequently, when the MOS transistors 10 and 11 turn to the conductive state by the application of high clock pulse $\phi$ in the time interval $S_7$, the level $Q_2$ changes to the low level because the level $Q_1$ remains high and the negative voltage $-V_{DD}$ from the power source charges capacitor 19 through conducting transistors 11 and 14.

To summarize the above operation, during the periods in which a clock pulse is applied to the circuit 200 the input signal D is transmitted unchanged to the output terminal 17. During the periods in which the clock pulse is not applied, the switching transistors 10 and 11 are non-conductive and hence the output signal $Q_2$ does not change its level even if the level of the input signal D changes. The output signal $Q_2$ is stored at the output terminal temporarily until the next clock pulse $\phi$ is impressed on the circuit 200.

According to the above embodiment, no DC current path from the power supply to the ground is formed during any operational period so that the power dissipation of the circuit is low. Moreover, only 1 clock signal is required.

Figure 4:
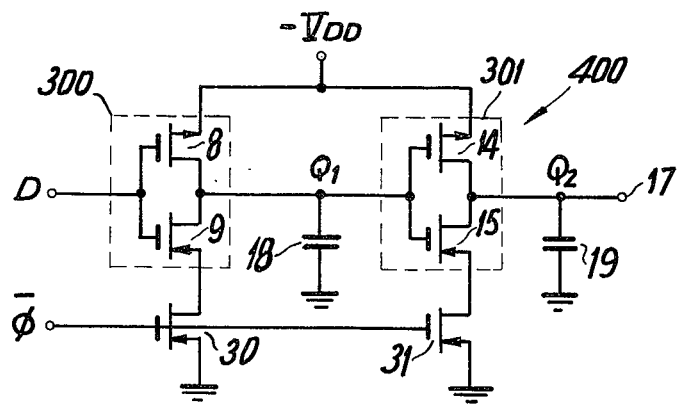
FIGS. 4, 5 and 6 are circuit diagrams each showing an alternative embodiment of the present invention.

FIG. 4 shows a D-type flip-flop 400 which is another embodiment of the present invention. In this embodiment, P-channel MOS transistors 30 and 31 are substituted for the N-channel MOS transistors 10 and 11 as shown in FIG. 2. The source electrodes of transistors 30 and 31 are connected to ground. The drain electrode of transistor 30 is connected to the source electrode of transistor 9 of the inverter circuit 300. The drain electrode of transistor 31 is connected to the source electrode of transistor 15 of the inverter circuit 301. The source electrodes of the N-channel MOS transistors 8 and 14 of inverter circuits 300 and 301 respectively are connected to the power source ($-V_{DD}$). The D-type flip-flop 400 operates in the manner described above for the flip-flop circuit 200 in FIG. 2 except that a clock signal $\overline{\phi}$ opposite in polarity to the clock signal $\phi$ shown in FIGS. 2 and 3 is used for controlling the switching transistors 30 and 31.

It is also possible to replace the N-channel MOS transistors 10 and 11 shown in FIG. 2 by P-channel MOS transistors and the P-channel MOS transistors 30 and 31 shown in FIG. 4 can be replaced by N-channel MOS transistors. In order to make the amplitude of the output signal greater and to raise the operating speed, however, the circuit arrangements shown in FIGS. 2 and 4 are more advantageous.

Figure 5:
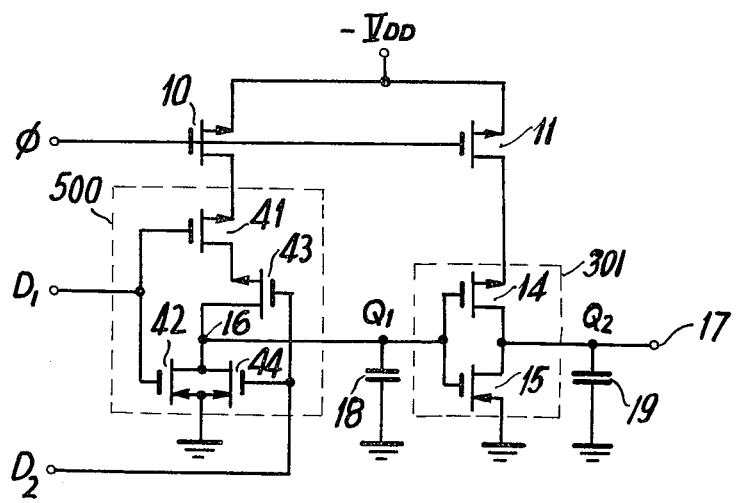

FIG. 5 shows still another embodiment of the present invention. This embodiment substitutes a conventional NAND gate circuit 500 for the inverter circuit 300 as the logic operation means in the circuit of FIG. 2. This circuit can perform the logic operation using a plurality of input signals $D_1$ and $D_2$. It is apparent that, even when the NAND circuit 500 is replaced by another logic operation circuit, for example, a NOR circuit, a similar operation can be effected. A circuit diagram with a NOR circuit 600 utilized as the logic operation circuit is shown in FIG. 6.

The NAND circuit 500 shown in FIG. 5 is composed of the N-channel MOS transistors 41 and 43 and the P-channel MOS transistors 42 and 44. The N-channel MOS transistors 41 and 43 are connected in series by having the drain of the transistor 41 and the source of the transistor 43 connected to each other. The P-channel MOS transistors 42 and 44 are connected in parallel by having their respective drains connected and their respective sources connected. The common connection of the sources of transistors 42 and 44 is grounded while the common connection of the drains of these transistors is connected through terminal 16 to the drain of the transistor 43. The source of the transistor 41 is connected to the drain of the first switching transistor 10. The gates of the transistors 41 and 42 are commonly connected and are supplied with a first input signal $D_1$. The gates of the transistors 43 and 44 are commonly connected and are supplied with a second input signal $D_2$. The output terminal of the NAND circuit 500 is led out from the terminal 16. The circuit 500 employs two complementary transistor pairs; one being constituted of the N-channel MOS transistor 41 and the P-channel MOS transistor 42 and the other being constituted of the N-channel MOS transistor 43 and the P-channel MOS transistor 44. Other components of FIG. 5 are connected as described above with reference to FIG. 2.

The operation of the circuit in FIG. 5 will be explained with reference to FIG. 3. The clock signal $\phi$ which is applied to the gates of the transistors 10 and 11 is at the high level during the time interval $S_1$ and hence the transistors 10 and 11 are conductive. This permits the NAND circuit 500 and the inverter circuit 301 to effect the NAND operation and the inverter operation, respectively. If at least one of the input signals $D_1$ and $D_2$ to the NAND circuit is at the low level in this interval $S_1$, the output level $Q_1$ of the NAND circuit 500 will be high. This is so since if $D_1$ is low transistor 42 will conduct grounding $Q_1$ and if $D_2$ is low transistor 44 will conduct grounding $Q_1$. In either case $Q_1$ will be high (i.e., at 0 volts). With $Q_1$ high the output level $Q_2$ of the inverter circuit 301 will be at the low level for the reasons described above with reference to FIG. 2. In the time interval $S_2$ the clock signal $\phi$ becomes low and hence the transistors 10 and 11 switch to the non-conductive state so that the path from the low power supply $-V_{DD}$ is cut. The output level $Q_1$ remains high and the output level $Q_2$ remains low during period $S_2$. If both the input signals $D_1$ and $D_2$ are the high level during the time interval $S_3$ the N-channel MOS transistors 41 and 43 will be conductive. However, since the clock signal $\phi$ is low the transistor 10 is non-conductive cutting off the path to power supply $-V_{DD}$ so that the level $Q_1$ remains high. As the result, the level $Q_2$ does not change, remaining low. When the clock signal $\phi$ becomes high during period $S_4$ transistors 10 and 11 turn to the conductive state. If both $D_1$ and $D_2$ are high the power supply will put a negative charge on capacitor 18 causing $Q_1$ to be low which in turn will cause $Q_2$ to be high as described above with reference to FIG. 2. The clock signal becomes low in period $S_5$ causing the transistors 10 and 11 to become non-conductive. If both $D_1$ and $D_2$ remain high the levels $Q_1$ and $Q_2$ will remain at the low and high levels, respectively. If at least one of the input signals $D_1$ and $D_2$ is at the low level in the time interval $S_6$, at least one of the transistors 42 and 44 will be conductive. This will permit the charge to leak off capacitor 18 and $Q_1$ turns to the high level. The level $Q_2$ is maintained high since transistor 11 is non-conducting. The transistors 10 and 11 turn to the conductive state in the time interval $S_7$ since clock signal $\phi$ is high and hence the level $Q_2$ changes to the low level because the high level of $Q_1$ causes transistor 14 to be conductive connecting capacitor 19 to negative power supply $-V_{DD}$. So that if the time intervals during which at least one of the input signals $D_1$ and $D_2$ is at the low level corresponds to the time intervals of FIG. 3 during which the input signal D is at the low level and if the intervals during which both of the input signals $D_1$ and $D_2$ are at a high level corresponds with the intervals of FIG. 3 during which the input signal D is at the high level, the circuit of FIG. 5 will perform as a D-type flip-flop in a manner analogous to FIG. 2.

Figure 6:
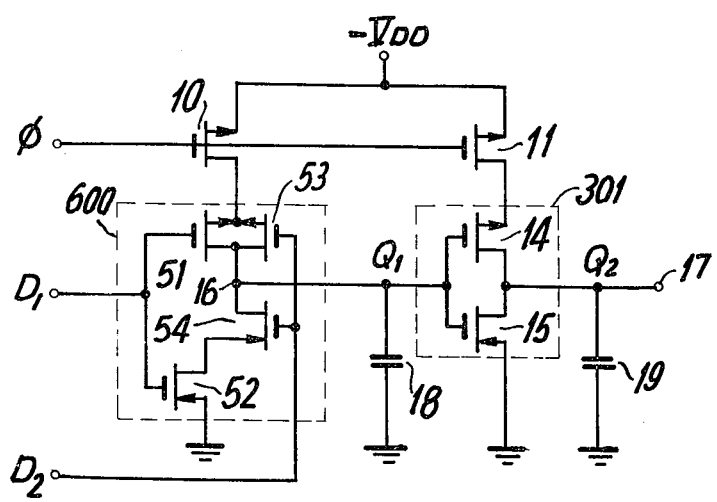

The NOR circuit 600 in FIG. 6 is composed of N-channel MOS transistors 51 and 53 and P-channel MOS transistors 52 and 54. The N-channel MOS transistors 51 and 53 are connected in parallel by having their respective sources connected and their respective drains connected. The P-channel MOS transistors 52 and 54 are connected in series in such way that the drain of the transistor 52 and the source of the transistor 54 are connected to each other. The common source connection of the parallel transistors 51 and 53 is connected to the drain of the first switching transistor 10, while the common drain connection of these transistors is connected to the drain of the transistor 54 through terminal 16. The source of the transistor 52 is grounded. The gates of the transistors 51 and 52 are connected in common and are supplied with a first input signal $D_1$, while the gates of the transistors 53 and 54 are connected in common and are supplied with a second input signal $D_2$. The output terminal of the NOR circuit 600 is connected to the terminal 16. In the NOR circuit 600 the complementary transistor pairs consist of a first pair comprising the N-channel transistor 51 and the P-channel transistor 52, and a second pair comprising the N-channel transistor 53 and the P-channel transistor 54.

The operation of the circuit in FIG. 6 will now be described with reference to FIG. 3. The clock signal, which is applied to the gates of the transistors 10 and 11, is at a high level in the interval $S_1$. Therefore, the NOR circuit 600 and the inverter 301 effect the NOR operation and the inverter operation, respectively. If both of the input signals $D_1$ and $D_2$ are at the low level in this interval $S_1$, the output levels $Q_1$ and $Q_2$ are high and low, respectively. This is so since transistors 52 and 54 will then be conductive causing point 16 and $Q_1$ to be at ground or high level. If $Q_1$ is high $Q_2$ will be low as described in reference to FIG. 2. In the interval $S_2$ the clock signal $\phi$ turns to the low level and hence the transistors 10 and 11 are in the non-conductive state. This cuts off the path to power supply $-V_{DD}$ and $Q_1$ remains high so the level $Q_2$ is maintained at the low level. If at least one of the input signals $D_1$ and $D_2$ is at the high level in the interval $S_3$, at least one of the N-channel MOS transistors 51 and 53 will be conductive. However, since the clock signal $\phi$ is low the transistor 10 is not conductive and hence the level $Q_1$ remains at the high level. Consequently, the level $Q_2$ is held at the low level. When the clock signal $\phi$ becomes high turning the transistors 10 and 11 to the conductive state in the interval $S_4$, the levels $Q_1$ and $Q_2$ change to the low and high levels respectively for the first time, if at least one of signals $D_1$ and $D_2$ is high. This is so since either transistor 51 or transistor 53 will then provide a connection between terminal 16 and the negative power supply $-V_{DD}$ causing capacitor 18 to charge making $Q_1$ low which in turn causes $Q_2$ to become high. Since the transistors 10 and 11 turn to the non-conductive state in the interval $S_5$, the levels $Q_1$ and $Q_2$ remain at the low and high levels, respectively, if at least one of the signals $D_1$ and $D_2$ are high. If both of the input signals $D_1$ and $D_2$ are at the low level in the interval $S_6$, the P-channel MOS transistors 52 and 54 will be conductive. As the result, the level $Q_1$ turns to the high level since these transistors provide a path to ground. The level $Q_2$ is maintained at the high level, however, since the path to power source $-V_{DD}$ is cut off. The transistors 10 and 11 turn to the conductive state in the interval $S_7$ and hence the level $Q_2$ changes to the low level because the level $Q_1$ is high causing transistor 14 to be conductive and to provide a path to the negative power source. From the above, it is apparent that the circuit of FIG. 6 performs as a D-type flip-flop.

Figure 7:
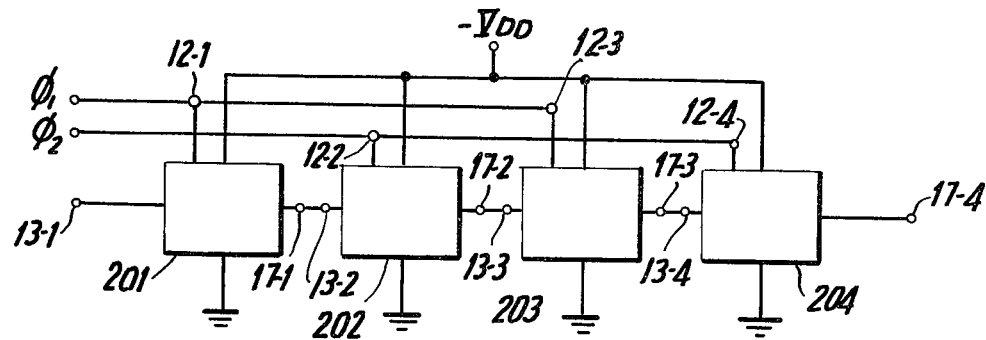
FIGS. 7 and 8 are block diagrams each showing example applications of some of the gate circuit embodiments of the present invention.

FIG. 7 is a block diagram showing a first example of an application in which gate circuits such as 200 or 400 according to the present invention can be connected in cascade to construct a shift register. In this block diagram, D-type flip-flop circuits 201, 202, 203 and 204 are respectively connected in cascade. A first clock signal $\phi_1$ is applied to control terminals 12-1 and 12-3 and a second clock signal $\phi_2$ is applied to control terminals 12-2 and 12-4. The clock signals $\phi_1$ and $\phi_2$ are the same in polarity but different in phase. For the D-type flip-flop circuits 201 to 204 in FIG. 7, either the D-type flip-flop circuit 200 in FIG. 2 or the D-type flip-flop circuit 400 in FIG. 4 can be used.

When the prior-art D-type flip-flop circuit 100 shown in FIG. 1 is used for the D-type flip-flop circuits 201 to 204, four clock signals ($\phi_1$, $\overline{\phi_1}$ and $\phi_2$, $\overline{\phi_2}$) are necessary consisting of two sets of clock signals which are mutually opposite in polarity. In contrast, using the flip-flop circuit of the present invention, only two clock signals $\phi_1$ and $\phi_2$ are required as controlling signals for a shift register shown in FIG. 7.

Figure 8:
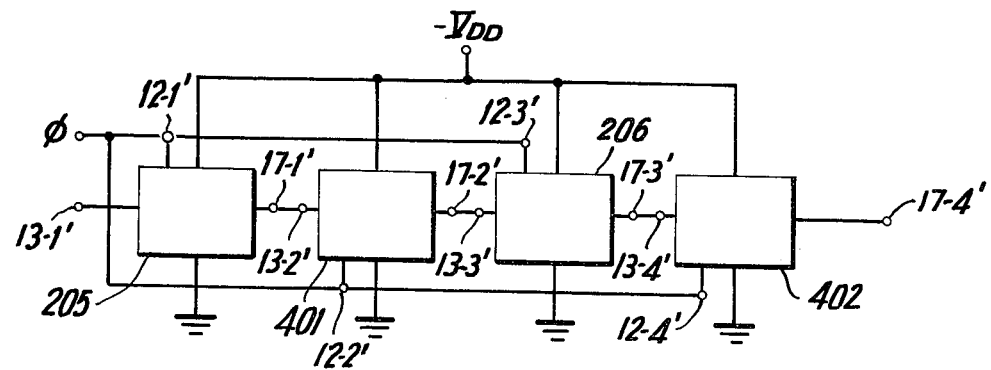

FIG. 8 illustrates another example of an application in which the D-type flip-flop circuits 200 and 400 of the present invention are alternately connected in cascade to construct a shift register. That is, the flip-flop circuit 200 according to this invention is employed as the D-type flip-flop circuits 205 and 206, and the flip-flop circuit 400 according to this invention is employed as the D-type flip-flop circuits 401 and 402. These circuits are alternated and are connected in cascade, as shown in FIG. 8. In accordance with the example shown in FIG. 8, the operation of the shift register can be effected with only one clock signal $\phi$ by applying it to control terminals 12-1', 12-2', 12-3' and 12-4' of the gate circuits 205, 401, 206 and 402.

While the present invention has been described above in connection with the preferred embodiments, it is not restricted thereto but can have a variety of modifications, as those skilled in the art will be aware.

I claim:
1. A gate circuit including
   a power source having first and second terminals;
   a logic circuit including at least one complementary pair of insulated gate field effect transistors, said logic circuit having at least one input terminal, an output terminal, a first biasing terminal and a second biasing terminal, said first biasing terminal of said logic circuit being directly and continuously connected to said first terminal of said power source;
   means for applying an input signal to said input terminal of said logic circuit;
   first switching means connected between said second terminal of said power source and said second biasing terminal of said logic circuit;
   a first inverter circuit including a complementary pair of insulated gate field effect transistors, said first inverter circuit having an input terminal, an output terminal, a first biasing terminal and a second biasing terminal, said input terminal of said inverter circuit being connected to said output terminal of said logic circuit and said first biasing terminal of said inverter circuit being directly and continuously connected to said first terminal of said power source;
   second switching means connected between said second terminal of said power source and said second biasing terminal of said inverter circuit; and
   means for applying a common control signal to both said first and said second switching means, said common control signal including at least a first and second sequential pulses, and wherein an output signal is generated at said output terminal of said inverter circuit in response to said input signal which is applied to said input terminal of said logic circuit while said first pulse is being applied to said first and second switching means and said output signal is stored at said output terminal of said inverter circuit until said second pulse is applied to said first and second switching means.

2. A gate circuit as claimed in claim 1 wherein said logic circuit includes a second inverter circuit.

3. A gate circuit as claimed in claim 1 wherein said logic circuit includes:
   a first insulated gate field effect transistor of a first conductivity type;
   a second insultated gate field effect transistor of a second conductivity type opposite to said first conductivity type;
   the gate electrodes of said first and second transistors being connected together at a first common point, said input terminal of said logic circuit being connected to said first common point;
   the drain electrodes of said first and second transistors being connected together at a second common point, said output terminal of said logic circuit being connected to said second common connection point, the source electrode of said first transistor being connected to said first biasing terminal of said logic circuit;
   said first switching means including a third field effect transistor of said second conductivity type;
   the source electrode of said third transistor being connected to said second terminal of said power source;
   the gate electrode of said third transistor being connected to said means for applying a control signal; and
   the drain electrode of said third transistor and the source electrode of said second transistor being commonly connected to said second biasing terminal of said logic circuit.

4. A gate circuit as claimed in claim 3 wherein said first inverter circuit includes:
   a fourth insulated gate field effect transistor of said first conductivity type;
   a fifth insulated gate field effect transistor of said second conductivity type;
   the gate electrodes of said fourth and fifth transistors being connected together at a third common point, said input terminal of said first inverter circuit being connected to said third common point, said third common point being connected to said second common point;
   the drain electrodes of said fourth and fifth transistors being connected together at a fourth common point, said output terminal of said inverter circuit being connected to said fourth common point;

the source electrode of said fourth transistor being connected to said first biasing terminal of said inverter circuit;

said second switching means including a sixth insulated gate field effect transistor of said second conductivity type;

the source electrode of said sixth transistor being connected to said second terminal of said power source;

the gate electrode of said sixth transistor being connected to the gate of said third transistor and to said means for applying a control signal; and the drain of said sixth transistor and the source electrode of said fifth transistor being commonly connected to said second biasing terminal of said inverter circuit.

5. A gate circuit as claimed in claim 1 wherein said logic circuit includes:

a first insulated gate field effect transistor of a first conductivity type and a second field effect transistor of a second conductivity type opposite to said first conductivity type;

the gate electrodes of said first and second transistors being connected together at a first common point, said input terminal of said logic circuit being connected to said first common point;

the drain electrodes of said first and second transistors being connected together at a second common point, said output terminal of said logic circuit being connected to said second common point;

the source electrode of said second transistor being connected to said first biasing terminal of said logic circuit;

the source electrode of said first transistor being connected to said second biasing terminal of said logic circuit.

6. A gate circuit including a power source having first and second terminals;

a first insulated gate field effect transistor of a first conductivity type;

a second insulated gate field effect transistor of a second conductivity type opposite to said first conductivity type, the gate electrodes of said first and said second transistors being connected together at a first common point, the drain electrodes of said first and second transistors being connected together at a second common point, and the source electrode of said first transistor being connected directly and continuously to said first terminal of said power source;

means for applying an input signal to said first common point;

a third insulated gate field effect transistor of said second conductivity type, the drain electrode of said third transistor being connected to the source electrode of said second transistor, the source electrode of said third transistor being connected to said second terminal of said power source;

a fourth insulated gate field effect transistor of said first conductivity type;

a fifth insulated gate field effect transistor of said second conductivity type, the gate electrodes of said fourth and fifth transistors being connected together at a third common point, said third common point being connected to said second common point, the drain electrodes of said fourth and fifth transistors being connected together at a fourth common point, and the source electrode of said fourth transistor being directly and continuously connected to said first terminal of said power source;

a sixth insulated gate field effect transistor of said second conductivity type, the drain electrode of said sixth transistor being connected to the source electrode of said fifth transistor, the source electrode of said sixth transistor being connected to said second terminal of said power source; and means for applying a common control signal to the gate electrodes of said third and said sixth transistor, said common control signal including at least a first and second sequential pulses, and wherein an output signal is generated at said fourth common point in response to said input signal which is applied to said first common point while said first pulse is being applied to said first and second switching means, and said output signal is stored at said fourth common point until said second pulse is applied to said first and second switching means.

7. A gate circuit including:

a power source having first and second terminals;

a NAND circuit including at least one complementary pair of insulated gate field effect transistors, said NAND circuit having at least one input terminal, an output terminal, a first biasing terminal and a second biasing terminal, said first biasing terminal of said NAND circuit being directly and continuously connected to said first terminal of said power source;

first switching means connected between said second terminal of said power source and said second biasing terminal of said NAND circuit;

an inverter circuit including a complementary pair of insulated gate field effect transistors, said inverter circuit having an input terminal, an output terminal, a first biasing terminal and a second biasing terminal, said input terminal of said inverter circuit being connected to said output terminal of said NAND circuit and said first biasing terminal of said inverter circuit being directly and continuously connected to said first terminal of said power source;

second switching means connected between said second terminal of said power source and said second biasing terminal of said inverter circuit; and means for applying a common control signal to both said first and said second switching means.

8. A gate circuit including:

a power source having first and second terminals;

a logic circuit having first and second input terminals and an output terminal, first and second field effect transistors of a first conductivity type, and third and fourth field effect transistors of a second conductivity type opposite to said first conductivity type, the source electrodes of said first and second transistors being connected together at a first common point, which first common point is directly and continuously connected to said first terminal of said power source, the drain electrodes of said first and second transistors being connected together at a second common point, said second common point being connected to the drain electrode of said fourth transistor and to the output terminal of said logic circuit, the gate electrode of said first transistor being connected to the gate electrode of said third transistor at a third common point, said third common point being connected to said first input terminal of said circuit, the gate electrode of said second transistor being connected to the gate electrode of said fourth transistor at a fourth common point, said fourth common point being connected to said second input terminal of said logic circuit, and the drain electrode of said third transistor being connected to the source electrode of said fourth transistor;

first switching means connected between said second terminal of said power source and the source electrode of said third transistor;

an inverter circuit including a complementary pair of insulated gate field effect transistors, said inverter circuit having an input terminal, an output terminal, a first biasing terminal and a second biasing terminal, said input terminal of said inverter circuit being connected to said output terminal of said logic circuit and said first biasing terminal of said inverter circuit being directly and continuously connected to said first terminal of said power source;

second switching means connected between said second terminal of said power source and said second biasing terminal of said inverter circuit; and means for applying a common control signal to both said first and said second switching means.

9. A gate circuit including:

a power source having first and second terminals;

a NOR circuit including at least one complementary pair of insulated gate field effect transistors, said NOR circuit having at least one input terminal, an output terminal, a first biasing terminal and a second biasing terminal, said first biasing terminal of said NOR circuit being directly and continuously connected to said first terminal of said power source;

first switching means connected between said second terminal of said power source and said second biasing terminal of said NOR circuit;

an inverter circuit including a complementary pair of insulated gate field effect transistors, said inverter circuit having an input terminal, an output terminal, a first biasing terminal and a second biasing terminal, said input terminal of said inverter circuit being connected to said output terminal of said NOR circuit and said first biasing terminal of said inverter circuit being directly and continuously connected to said first terminal of said power source;

second switching means connected between said second terminal of said power source and said second biasing terminal of said inverter circuit; and means for applying a common control signal to both said first and second switching means.

10. A gate circuit including:

a power source having first and second terminals;

a logic circuit having first and second input terminals and an output terminal, first and second insulated gate field effect transistors of a first conductivity type, and third and fourth insulated gate field effect transistors of a second conductivity type opposite to said first conductivity type, the gate electrodes of said first and third transistors being connected together at a first common point, said first common point being connected to said first input terminal of said logic circuit, the gate electrodes of said second and fourth transistors being connected together at a second common point, said second common point being connected to said second input terminal of said logic circuit, the drain electrodes of said second and third transistors being connected together at a third common point, said third common point being connected to the drain electrode of said fourth transistor and to said output terminal of said logic circuit, the source electrodes of said third and fourth transistors being connected together at a fourth common point, the source electrode of said first transistor being connected directly and continuously to said first terminal of said power source, and the drain electrode of said first transistor being connected to the source electrode of said second transistor;

first switching means connected between said second terminal of said power source and said fourth common point;

an inverter circuit including a complementary pair of insulated gate field effect transistors, said first inverter circuit having an input terminal, an output terminal, a first biasing terminal and a second biasing terminal, said input terminal of said inverter circuit being connected to said output terminal of said logic circuit and said first biasing terminal of said inverter circuit being directly and continuously connected to said first terminal of said power source;

second switching means connected between said second terminal of said power source and said second biasing terminal of said inverter circuit; and means for applying a common control signal to both said first and said second switching means.

* * * * *

UNITED STATES PATENT OFFICE
CERTIFICATE OF CORRECTION

Patent No. 3,937,982           Dated February 10, 1976

Inventor(s) Toshio Nakajima

It is certified that error appears in the above-identified patent and that said Letters Patent are hereby corrected as shown below:

The name of the assignee should read:

--NIPPON ELECTRIC COMPANY, LIMITED--.

Signed and Sealed this

Twenty-seventh Day of July 1976

[SEAL]

Attest:

RUTH C. MASON
Attesting Officer

C. MARSHALL DANN
Commissioner of Patents and Trademarks